(12) United States Patent
Hirono et al.

(10) Patent No.: US 8,673,078 B2
(45) Date of Patent: Mar. 18, 2014

(54) TAKE-UP VACUUM PROCESSING APPARATUS

(75) Inventors: Takayoshi Hirono, Chigasaki (JP); Isao Tada, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 346 days.

(21) Appl. No.: 13/127,306

(22) PCT Filed: Oct. 27, 2009

(86) PCT No.: PCT/JP2009/005652
§ 371 (c)(1),
(2), (4) Date: May 3, 2011

(87) PCT Pub. No.: WO2010/052846
PCT Pub. Date: May 14, 2010

(65) Prior Publication Data
US 2011/0209830 A1 Sep. 1, 2011

(30) Foreign Application Priority Data
Nov. 5, 2008 (JP) .................................. 2008-283914

(51) Int. Cl.
*C23C 16/00* (2006.01)

(52) U.S. Cl.
USPC ...................... 118/718; 118/723 R; 118/723 E

(58) Field of Classification Search
USPC .......................................... 118/718, 723 MP
See application file for complete search history.

(56) References Cited

U.S. PATENT DOCUMENTS

| | | | |
|---|---|---|---|
| 4,064,030 A * | 12/1977 | Nakai et al. ............... | 204/192.36 |
| 4,968,918 A * | 11/1990 | Kondo et al. ............. | 315/111.21 |
| 5,300,189 A * | 4/1994 | Kokaku et al. ............ | 216/67 |
| 5,360,483 A * | 11/1994 | Kurokawa et al. ........ | 118/723 E |
| 5,437,725 A * | 8/1995 | Schuster et al. .......... | 118/718 |
| 5,743,966 A * | 4/1998 | Woolley et al. ........... | 118/718 |
| 6,110,540 A * | 8/2000 | Countrywood et al. ... | 427/569 |
| 6,116,185 A * | 9/2000 | Rietzel et al. ............. | 118/723 R |
| 2007/0123005 A1* | 5/2007 | Hiura et al. ............... | 438/478 |
| 2008/0085418 A1 | 4/2008 | Fukuda et al. | |

FOREIGN PATENT DOCUMENTS

| | | | |
|---|---|---|---|
| EP | 1792726 A1 | | 6/2007 |
| JP | 60237626 A | * | 11/1985 |
| JP | 06076281 A | * | 3/1994 |
| JP | 09228054 A | | 9/1997 |
| JP | 1999-140654 | | 5/1999 |
| JP | 2002-231642 | | 8/2002 |
| JP | 2002231642 A | * | 8/2002 |
| JP | 2003-049273 | | 2/2003 |

(Continued)

*Primary Examiner* — Karla Moore
(74) *Attorney, Agent, or Firm* — Harness, Dickey & Pierce, PLC

(57) ABSTRACT

A take-up vacuum processing apparatus includes a chamber, a roller-shaped first electrode rotatably disposed within the chamber, a gas supply unit including a second electrode, and a third electrode. The first electrode causes the flexible processing target to travel by rotating. The third electrode is connected to an alternating-current source and does not contact the first electrode. An alternating-current voltage of the alternating-current source is applied between the third electrode and the first electrode. The chamber includes a divider plate for separating the chamber into a first room in which the second electrode is arranged and a second room in which the third electrode is arranged. Pressures of the first and second rooms are individually adjusted, such that plasma can be generated between the first electrode and the second electrode, and such that anomalous discharge is not generated between the first electrode and the third electrode.

8 Claims, 3 Drawing Sheets

(56) References Cited

FOREIGN PATENT DOCUMENTS

| | | |
|---|---|---|
| JP | 3429369 A | 7/2003 |
| JP | 2003-292650 | 10/2003 |
| JP | 2008031521 A | 2/2008 |
| JP | 2008-190012 | 8/2008 |
| JP | 2008274312 A * | 11/2008 |
| WO | 2006033233 A1 | 3/2006 |
| WO | 2009093168 A1 | 9/2006 |

* cited by examiner

TAKE-UP VACUUM PROCESSING APPARATUS

TECHNICAL FIELD

The present invention relates to a take-up vacuum processing apparatus that continuously pays out a flexible processing target in a reduced-pressure atmosphere, bringing the paid-out processing target into close contact with a can roller, performing predetermined processing on the processing target positioned on the can roller, and taking up the processed processing target.

BACKGROUND ART

Conventionally, there is a thin-film forming apparatus that forms, while continuously paying out and taking up a magnetic recording medium by a roller, a thin film on a base body thereof. Such a thin-film forming apparatus generates plasma by a reaction gas between a can and a first anode arranged to be opposed to the can while bringing the magnetic recording medium into close contact with the rotating can to cause the magnetic recording medium to travel. Accordingly, a protective film is formed on the magnetic recording medium (see, for example, Patent Document 1).

In addition, there is a plasma processing apparatus that performs plasma processing (for example, RIE (Reactive Ion Etching)) while continuously paying out and taking up a plastic film of PET, PI (polyimide), or the like. Such a plasma processing apparatus generates plasma by a process gas between a can and an anode arranged to be opposed to the can while bringing the plastic film into close contact with the rotating can to causing the plastic film to travel. Accordingly, the film is etched and surface modification of the film can be performed.

Incidentally, in such thin-film forming apparatuses or processing apparatuses using plasma, a high-frequency power source is connected to the can and high frequency power is supplied by the high-frequency power source when the can is rotated at a predetermined speed. The rotating can and the stationary high-frequency power source are connected by a rotation introduction unit (not shown) such as a rotary connector using mercury, capacitor coupling constituted of a plurality of opposed flat plates, or a slip ring.

Patent Document 1: Japanese Patent No. 3429369

DISCLOSURE OF THE INVENTION

Problem to be Solved by the Invention

The rotary connector has the structure including an electrode connected on the can side to be rotated and a fixed electrode connected on the high-frequency power source side at both ends of a box in which mercury is sealed in. When a high-frequency wave of 13.56 MHz or the like is applied to such a rotary connector, heat is generated and there is a risk of breakage of the rotary connector. Therefore, the rotary connector is not suitable for the connection between the can and the high-frequency power source.

In the capacitor coupling constituted of a plurality of opposed flat plates, a plurality of rotating flat plates on one side are connected on the can side and a plurality of fixed flat plates opposed thereto on the other side are connected on the high-frequency power source side. In the technique of such a capacitor coupling, there is a fear that dielectric breakdown occurs at a high voltage in the case where those flat plates are put under an atmospheric pressure.

In the case where the slip ring is used as a connection portion of the high-frequency power source, there is a fear that breakage occurs due to heat generation. Further, since the slip ring has a contact-type electrode, wear of the electrode due to contact is caused and the slip ring is not suitable for life extension.

In view of the circumstances as described above, it is an object of the present invention to provide a take-up vacuum processing apparatus that prevents breakage due to heat generation and the occurrence of dielectric breakdown and is suitable for life extension.

Means for Solving the Problem

To achieve the above object, according to an embodiment of the present invention, there is provided a take-up vacuum processing apparatus including a chamber, a first electrode, a gas supply unit, and a third electrode.

The chamber is capable of maintaining a vacuum state.

The first electrode has a roller shape, is rotatably provided in the chamber, and is capable of causing a flexible processing target to travel by rotating, the processing target being in contact with the first electrode.

The gas supply unit includes a second electrode arranged to be opposed to the first electrode in the chamber and is capable of supplying a process gas between the processing target and the second electrode, the processing target being in contact with the first electrode.

The third electrode is arranged to be opposed to the first electrode in the chamber, and an alternating-current voltage by the alternating-current source is applied.

BEST MODES FOR CARRYING OUT THE INVENTION

Figure 1:
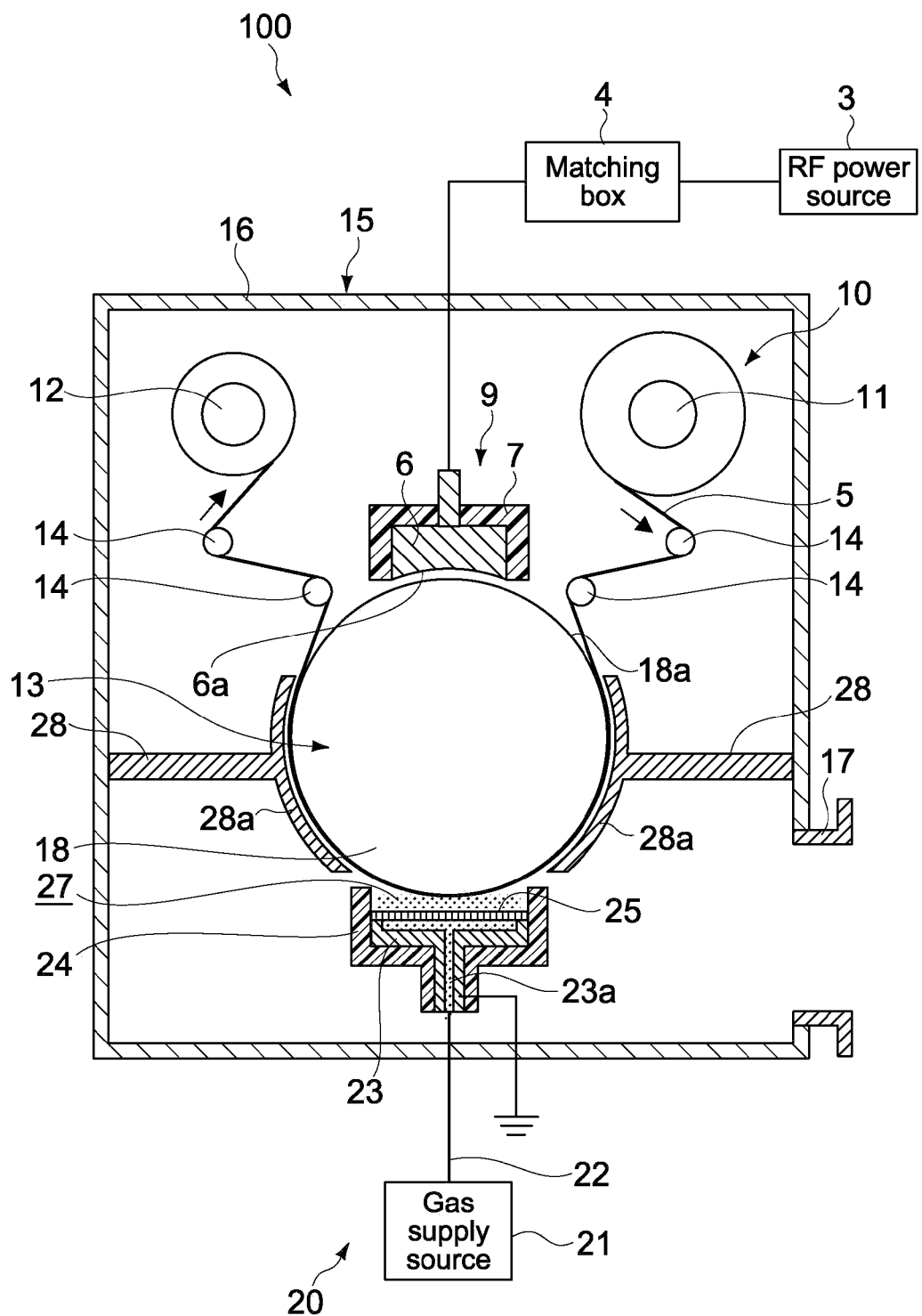
[FIG. 1] A configuration diagram schematically showing a plasma processing apparatus as a take-up vacuum processing apparatus according to an embodiment of the present invention.

According to an embodiment of the present invention, there is provided a take-up vacuum processing apparatus including a chamber, a first electrode, a gas supply unit, and a third electrode.

The chamber is capable of maintaining a vacuum state.

The first electrode has a roller shape, is rotatably provided in the chamber, and is capable of causing a flexible processing target to travel by rotating, the processing target being in contact with the first electrode.

The gas supply unit includes a second electrode arranged to be opposed to the first electrode in the chamber and is capable of supplying a process gas between the processing target and the second electrode, the processing target being in contact with the first electrode.

The third electrode is arranged to be opposed to the first electrode in the chamber, and an alternating-current voltage by the alternating-current source is applied.

Sine the third electrode is arranged in the chamber, in the case where the inside of the chamber is maintained in a predetermined degree of vacuum, the occurrence of dielectric breakdown can be prevented between the first electrode and the third electrode. Further, since the third electrode is arranged in a predetermined gap away from the first electrode, in other words, an alternating-current voltage is applied to the first electrode in a noncontact manner, wear due to contact is not caused and the life extension of the electrode can be achieved.

The first electrode may be provided to be extended in a direction of a rotation axis of the first electrode.

As the length of the third electrode in the direction of the rotation axis of the first electrode is closer to that of the first electrode in that direction, charge is uniformly generated in the first electrode and the third electrode. For example, in the case where an alternating-current source is connected to an end of a rotary shaft member of a can roller via a rotation introduction unit as in a conventional case, resistance to the supply of charge to the other end of the can roller in the direction of the rotation axis becomes larger as the length of the can roller in the direction of the rotation axis is larger. However, according to the take-up vacuum processing apparatus of this embodiment, such a problem of electrical resistance can be solved, with the result that plasma by a reaction gas can be uniformly generated between the first electrode and the second electrode.

The first electrode may have an outer circumferential surface, and the third electrode may have a surface opposed to the outer circumferential surface of the first electrode along the outer circumferential surface while keeping the gap constant.

Accordingly, a distance between the first electrode and the third electrode can be made substantially constant. As a result, plasma by a reaction gas can be uniformly generated between the first electrode and the second electrode.

The take-up vacuum processing apparatus may further include a temperature adjustment mechanism to cool or heat the first electrode.

Accordingly, the processing target coming into contact with the first electrode can be caused to travel while being cooled or heated.

The take-up vacuum processing apparatus may further include a cooling mechanism to cool the third electrode.

Accordingly, a problem due to heat generated from the third electrode, for example, breakage of the third electrode can be prevented. Further, since the third electrode is fixed, the installation of a water-cooling mechanism in the third electrode becomes easier than a conventional case where a cooling mechanism is provided to a rotation introduction unit.

Hereinafter, embodiments of the present invention will be described with reference to the drawings.

Figure 2:
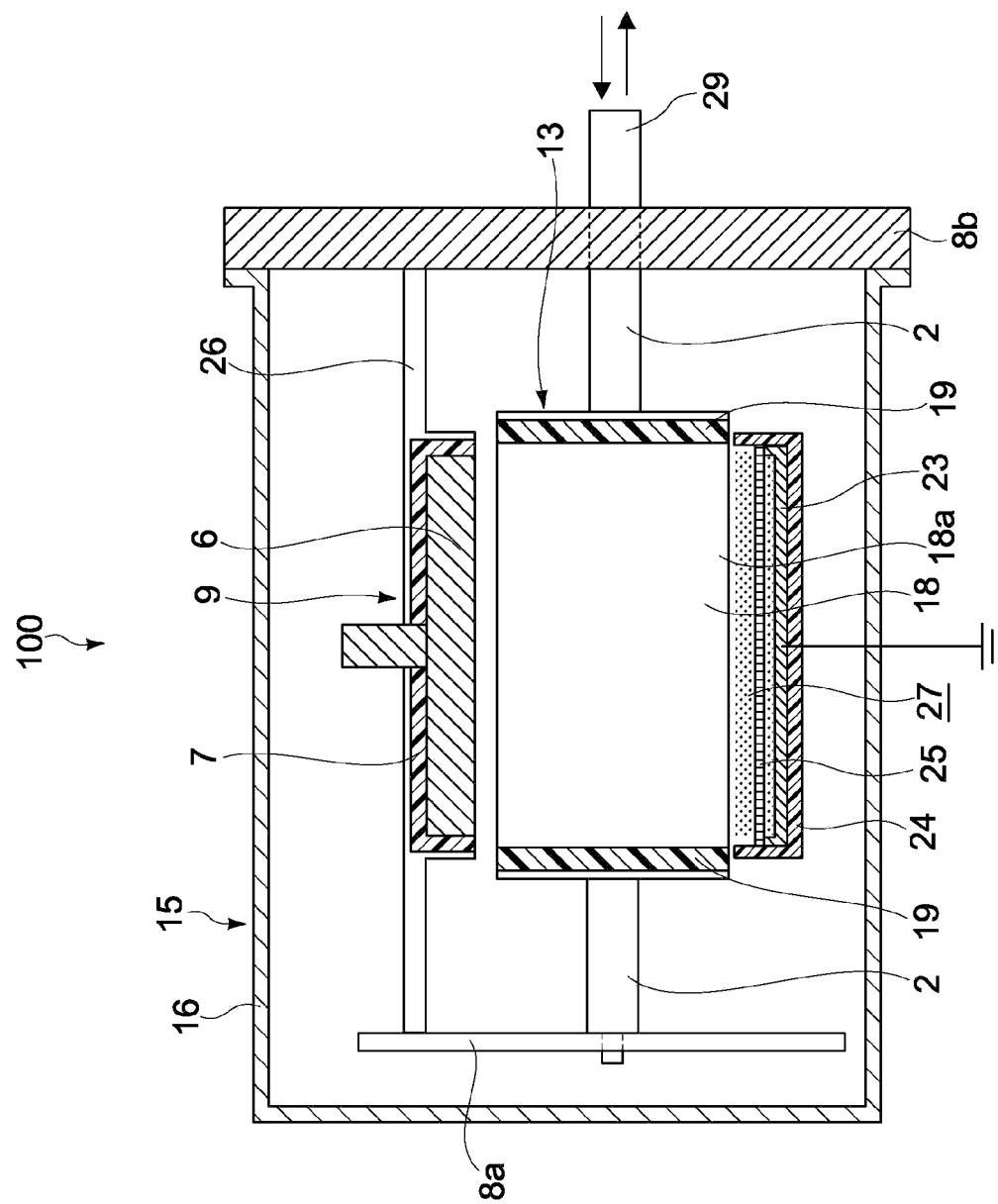
[FIG. 2] A side view schematically showing the plasma processing apparatus.

FIG. 1 is a configuration diagram schematically showing a plasma processing apparatus as a take-up vacuum processing apparatus according to an embodiment of the present invention. FIG. 2 is a side view schematically showing the plasma processing apparatus 100.

The plasma processing apparatus 100 uses, for example, a tape-like film 5 as a processing target. As a constituent material of the film 5, a resin film is used, for example, and typical examples thereof include materials having a heat resistant temperature of 200° or more, such as polyimide, polyamide, and aramid. However, the film 5 is not limited to a resin film and may be, for example, a magnetic film used in a magnetic recording medium or another film.

The plasma processing apparatus 100 includes a vacuum chamber 15, a traveling mechanism 10, a gas supply unit 20, an electrode unit 9, and an RF power source 3.

The vacuum chamber 15 includes a partition wall 16 with a connection portion 17 to which an exhaust pipe (not shown) is connected. A vacuum pump (not shown) is connected to the connection portion 17 via the exhaust pipe and a predetermined vacuum state is maintained in the vacuum chamber 15 by the actuation of the vacuum pump. The degree of vacuum thereof can be set in a known range suitable for plasma processing as appropriate. It should be noted that the vacuum chamber 15 is separated by divider plates 28 into a room in which the electrode unit 9 is arranged and a room in which a plasma generation unit including a counter electrode 23, which will be described later, is arranged.

The divider plates 28 each have an arc portion 28a provided so as to be opposed to a side surface of a can roller 13. Those arc portions 28a are provided so that conductance of gas between the rooms can be reduced. The reduction in conductance between the rooms makes it easier to individually adjust a pressure in each room. The pressure of the room in which the plasma generation unit including the counter electrode 23 is arranged is adjusted to a pressure suitable for plasma processing, and the pressure of the room in which the electrode unit 9 is arranged is adjusted to a pressure at which anomalous discharge or the like is not generated between the electrode unit 9 and the can roller 13. It is also preferable for an exhaust means to be connected to the room in which the electrode unit 9 is arranged and to exhaust air individually.

The traveling mechanism 10 is arranged in the vacuum chamber 15 and causes the film 5 to travel such that the film 5 can be subjected to surface treatment. Typically, the traveling mechanism 10 includes a pay-out roller 11 that feeds the film 5, the can roller 13 that touches and comes into close contact with the fed film 5 to cool the film 5 in close contact therewith, and a take-up roller 12 that takes up the film 5 fed from the can roller 13. Between the pay-out roller 11 and the can roller 13 and between the take-up roller 12 and the can roller 13, guide rollers 14 are provided. The film 5 comes into contact with an outer circumferential surface 18a of the can roller 13 at a predetermined holding angle.

As shown in FIG. 2, the can roller 13 has a cylindrical shape and a rotary shaft member 2 thereof is rotatably supported by a support member 8a and a base plate 8b, for example. The can roller 13 includes disc-like insulators 19 provided at both ends and a roller electrode 18 that is a conductive member sandwiched between those insulators 19. A cooling mechanism (not shown) is provided in the can roller 13 and the roller electrode 18 of the can roller 13 is mainly cooled. As the cooling mechanism, a mechanism of a system in which a coolant such as water or silicone oil circulates can be used. The coolant is introduced from, for example, an introduction pipe 29 for a coolant that is connected to the rotary shaft member 2, and is supplied to the inside of the can roller 13 by passing through the rotary shaft member 2.

Motors (not shown) are connected to the pay-out roller 11, the take-up roller 12, and the rotary shaft member 2 of the can roller 13. By the drive of those motors, the pay-out roller 11, the take-up roller 12, and the can roller 13 are rotated to give the film 5 power for traveling of the film 5.

It should be noted that the arrangement of the pay-out roller 11, the take-up roller 12, the can roller 13, and the guide rollers 14 is not limited to that shown in FIG. 1. Further, the number of guide rollers 14 is not limited to four as shown in FIG. 1 and any number of guide rollers 14 may be possible as long as a desired tension is held in the film 5.

The gas supply unit 20 includes a process gas supply source 21, the counter electrode 23 arranged so as to be opposed to the can roller 13 below the can roller 13, a supply pipe 22 that supplies a process gas from the gas supply source 21 to the counter electrode 23 side, and the like. The counter electrode 23 is arranged so as to be opposed to a position of the can roller 13 at which the film 5 is brought into contact therewith. The counter electrode 23 is provided with an introduction inlet 23a through which the process gas is introduced from the supply pipe 22. On the can roller 13 side of the counter electrode 23, a shower plate 25 attached to an insulating material 24 arranged around the counter electrode 23 is arranged. The shower plate 25 may be formed of a conductor and may constitute a part of the counter electrode 23. Further, the process gas may be introduced from a gas nozzle without using a shower plate.

The process gas supplied onto the counter electrode 23 from the supply pipe 22 via the introduction inlet 23a is supplied via the shower plate 25 to a reaction area 27 formed between the can roller 13 and the shower plate 25. The counter electrode 23 is set to a ground potential, for example. Therefore, by an RF high frequency voltage applied between an RF electrode 6 and the roller electrode 18 by an RF power source 3 to be described later, plasma by a reaction gas is generated in the reaction area 27.

As the process gas, a plasma processing gas, a reaction gas for deposition, a cleaning gas, an etching gas, a purge gas, or the like is selected to be used as appropriate in accordance with application. The gas supply unit 20 includes the supply pipe 22 for gas, such as a gas cylinder corresponding to gas to be used.

The process gas is set as appropriate depending on types of processes such as plasma processing and etching or types of films formed on the film 5 by CVD or the like. In this embodiment, for example, an argon gas or a nitrogen gas is introduced and plasma is generated accordingly so that the film 5 can undergo surface modification by being subjected to the plasma processing. By the uniform surface modification, it is possible to uniformly improve adhesiveness of a thin film to the film 5, the thin film being formed by a subsequent deposition process.

The electrode unit 9 includes the RF electrode 6, the RF power source 3 that generates a high frequency power, a matching box 4 connected between the RF power source 3 and the RF electrode 6 and performing impedance matching or the like, and the like.

For example, the RF electrode 6 is arranged in a predetermined gap between the RF electrode 6 and an outer circumferential surface of a part of the can roller 13 that is not brought into contact with the film 5, that is, the outer circumferential surface 18a of the roller electrode 18. The gap can be changed as appropriate. However, in order to efficiently propagate a high-frequency wave and prevent short-circuiting of the RF electrode 6 and the can roller 13, it is preferable for the gap to be adjusted to, for example, 1 to 5 mm, though an optimum distance differs depending on a pressure. The electrode unit 9 includes an insulator 7, a holding member 26 that holds the insulator and the RF electrode 6, and the like, and the holding member 26 is supported by, for example, the support member 8a and the base plate 8b. A surface 6a of the RF electrode 6 that is opposed to the roller electrode 18 is formed in such a form that suits a cylindrical shape (for example, inner surface shape of cylinder), which is the shape of the outer circumferential surface 18a of the roller electrode 18. An area of the RF electrode 6 that is opposed to the roller electrode 18 is increased, thus improving the propagation efficiency of a high-frequency wave from the RF electrode 6 to the roller electrode 18. The RF electrode 6 is provided so as to be extended in a direction of a rotation axis of the can roller 13. Typically, the RF electrode 6 is formed to have a length that is substantially the same as that of the roller electrode 18 in a direction of a rotation axis thereof, or a length close to that of the roller electrode 18.

In the plasma processing apparatus 100 structured as described above, when an RF voltage is applied to the RF electrode 6, the RF voltage is applied to the roller electrode 18 via a space defined between the RF electrode 6 and the roller electrode 18. Accordingly, plasma by the process gas is generated in the reaction area 27 between the roller electrode 18 and the counter electrode 23 set to a ground potential. Accordingly, the film 5 that travels while being cooled or heated in close contact with the can roller 13 is exposed to plasma and the surface thereof is modified.

As described above, in this embodiment, the RF electrode 6 is arranged in the vacuum chamber 15. Therefore, for example, compared to the case where a rotation introduction unit such as a capacitor coupling as described above is arranged in an atmospheric pressure, if the inside of the vacuum chamber 15 is maintained in a predetermined degree of vacuum, the occurrence of dielectric breakdown between the roller electrode 18 and the RF electrode 6 can be prevented. Further, there are caused no problems of breakage due to heat generation in a conventional rotation introduction unit such as a rotary connector.

Further, since the RF electrode 6 is arranged in a predetermined gap away from the roller electrode 18, in other words, an alternating-current voltage is applied to the roller electrode 18 in a noncontact manner, wear due to contact is not caused and the life extension of the RF electrode 6 can be achieved.

Since the RF electrode 6 is provided so as to be extended in the direction of the rotation axis of the can roller 13, charge is uniformly generated in the roller electrode 18 and the RF electrode 6. For example, in the case where an alternating-current source is connected to an end of the rotary shaft member of the can roller via a rotation introduction unit as in a conventional case, resistance to the supply of charge to the other end of the can roller (opposite side of the end described above) becomes larger as the length of the can roller in the direction of the rotation axis is larger. However, according to this embodiment, such a problem of electrical resistance can be solved, with the result that plasma by the reaction gas can be uniformly generated in the reaction area 27. Further, the RF electrode 6 can be easily made large and an area of the RF electrode 6 that is opposed to the roller electrode 18 can be formed larger.

Figure 3:
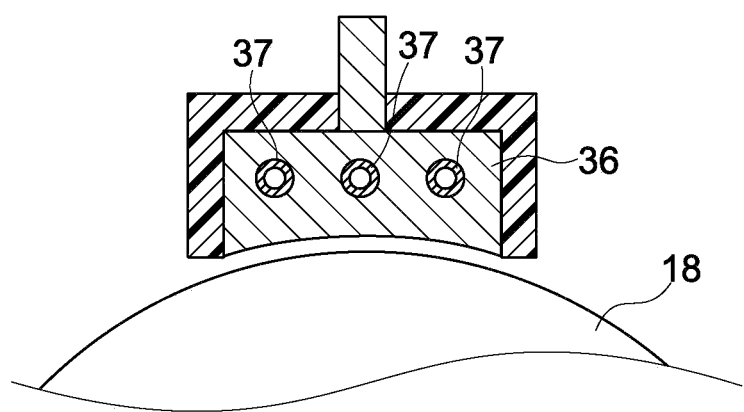
[FIG. 3] A cross-sectional view showing an electrode unit according to another embodiment.

FIG. 3 is a cross-sectional view showing an electrode unit according to another embodiment. A cooling mechanism is provided in an RF electrode 36 of the electrode unit that is arranged above the roller electrode 18. This cooling mechanism typically includes water passages 37 through which a cooling medium passes, and a cooling system in which a liquid-phase medium circulates in the water passages 37 or a cooling system using a phase change of a coolant due to coolant circulation is used, for example. Examples of the liquid-phase medium include water and silicone oil.

In this manner, the RF electrode 36 is cooled by the cooling mechanism, with the result that a problem of heat generated from the RF electrode 36, for example, breakage of the RF electrode 36, can be prevented. Further, since the RF electrode 36 is fixed, the installation of a water-cooling mechanism in the RF electrode 36 becomes easier than a conventional case where a cooling mechanism is provided to a rotation introduction unit.

Embodiments according to the present invention are not limited to the embodiments described above and various embodiments are conceived.

As the take-up vacuum processing apparatus according to the embodiments described above, the plasma processing apparatus 100 has been described as an example. However, a plasma CVD apparatus or an apparatus using plasma etching or plasma can be realized as long as the apparatus can process a flexible processing target.

The arrangement, size, or the like of the RF electrodes 6 and 36 and counter electrode 23 can be set as appropriate.

DESCRIPTION OF SYMBOLS

3 RF power source
5 film
6,36 RF electrode
7 insulator
9 electrode unit
10 traveling mechanism
13 can roller
15 vacuum chamber
18 roller electrode
18a outer circumferential surface
20 gas supply unit
21 gas supply source
22 supply pipe
23 counter electrode
36 RF electrode
37 water passage
100 plasma processing apparatus

The invention claimed is:

1. A take-up vacuum processing apparatus, comprising:
a chamber capable of maintaining a vacuum state;
a roller-shaped first electrode rotatably disposed within the chamber, the first electrode including a first portion in contact with a flexible processing target and a second portion not in contact with the flexible processing target, the first electrode being capable of causing the flexible processing target to travel by rotating;
a gas supply unit including a second electrode arranged to be opposed to the first electrode in the chamber and being capable of supplying a process gas between the flexible processing target and the second electrode; and
a third electrode that is connected to an alternating-current source and arranged, without contact with the first electrode, to be opposed to the second portion of the first electrode in the chamber, an alternating-current voltage of the alternating-current source being applied between the third electrode and the first electrode, wherein
the chamber includes a divider plate for separating the chamber into a first room in which the second electrode is arranged and a second room in which the third electrode is arranged, and
a pressure of the first room and a pressure of the second room are individually adjusted, such that plasma can be generated between the first electrode and the second electrode, and such that anomalous discharge is not generated between the first electrode and the third electrode.

2. The take-up vacuum processing apparatus according to claim 1, wherein
the first electrode is provided to be extended in a direction of a rotation axis of the first electrode.

3. The take-up vacuum processing apparatus according to claim 1, wherein
the first electrode has an outer circumferential surface, and
the third electrode has a surface opposed to the outer circumferential surface of the first electrode along the outer circumferential surface.

4. The take-up vacuum processing apparatus according to claim 1, further comprising a temperature adjustment mechanism to cool or heat the first electrode.

5. The take-up vacuum processing apparatus according to claim 4, further comprising a cooling mechanism to cool the third electrode.

6. The take-up vacuum processing apparatus according to claim 1, wherein
the divider plate includes an arc portion provided to be opposed to the first electrode.

7. The take-up vacuum processing apparatus according to claim 1, wherein
a gap between the first electrode and the third electrode is from 1 mm to 5 mm.

8. The take-up vacuum processing apparatus according to claim 1, wherein
the pressure of the first room is adjusted to a pressure suitable for plasma processing, and
the pressure of the second room is adjusted to a pressure at which anomalous discharge is not generated between the first electrode and the third electrode.

* * * * *